(12) United States Patent
Phillips

(10) Patent No.: US 10,114,193 B2
(45) Date of Patent: Oct. 30, 2018

(54) FLY'S EYE OPTICAL MIRROR WITH A PLURALITY OF OPTICAL ELEMENTS ROTATIONALLY ALIGNED ALONG TWO AXES

(75) Inventor: Alton H. Phillips, East Palo Alto, CA (US)

(73) Assignee: Nikon Corporation (JP)

( * ) Notice: Subject to any disclaimer, the term of this patent is extended or adjusted under 35 U.S.C. 154(b) by 422 days.

(21) Appl. No.: 14/118,858

(22) PCT Filed: Dec. 16, 2011

(86) PCT No.: PCT/US2011/065614
§ 371 (c)(1),
(2), (4) Date: Nov. 19, 2013

(87) PCT Pub. No.: WO2012/166204
PCT Pub. Date: Dec. 6, 2012

(65) Prior Publication Data
US 2014/0071419 A1    Mar. 13, 2014

Related U.S. Application Data

(60) Provisional application No. 61/492,725, filed on Jun. 2, 2011.

(51) Int. Cl.
*G02B 5/08* (2006.01)
*G03B 27/54* (2006.01)
(Continued)

(52) U.S. Cl.
CPC ......... *G02B 7/1822* (2013.01); *G02B 5/0891* (2013.01); *G02B 5/09* (2013.01);
(Continued)

(58) Field of Classification Search
CPC ...... G02B 5/0891; G02B 5/09; G02B 7/1815; G02B 7/1822; G02B 27/0905;
(Continued)

(56) References Cited

U.S. PATENT DOCUMENTS

| 5,327,808 A | 7/1994 | Nagata et al. |
| 7,136,214 B2 | 11/2006 | Loopstra et al. |

(Continued)

FOREIGN PATENT DOCUMENTS

| WO | WO 2010/051234 | 5/2010 |
| WO | WO 2012/174108 | 12/2012 |

OTHER PUBLICATIONS

International Search Report from PCT/US2011/065614, dated Apr. 23, 2012.
(Continued)

*Primary Examiner* — Colin Kreutzer
(74) *Attorney, Agent, or Firm* — Roeder & Broder LLP; Steven G. Roeder

(57) ABSTRACT

A fly's eye mirror including first and second complementary M×N arrays, each including a plurality of faceted reflective surfaces arranged along both the first and the second axes. When assembled, the two complementary arrays are integrated together and mounted onto a common base plate. With the increased lineal length of each array along both axes, the faceted reflective surfaces of each array are in rotational or tilt alignment with a base plate along both axes.

29 Claims, 8 Drawing Sheets

(51) Int. Cl.
*G02B 7/182* (2006.01)
*G03F 7/20* (2006.01)
*G02B 7/18* (2006.01)
*G02B 5/09* (2006.01)
*G02B 27/09* (2006.01)

(52) U.S. Cl.
CPC ....... *G02B 7/1815* (2013.01); *G02B 27/0905* (2013.01); *G02B 27/0977* (2013.01); *G03F 7/702* (2013.01); *G03F 7/70008* (2013.01); *G03F 7/70075* (2013.01); *G03F 7/70108* (2013.01); *G03F 7/70233* (2013.01); *G03F 7/70825* (2013.01); *G03F 7/70891* (2013.01)

(58) Field of Classification Search
CPC ............. G02B 27/0977; G03F 7/70008; G03F 7/70075; G03F 7/70108; G03F 7/702; G03F 7/70233; G03F 7/70825; G03F 7/70891
USPC .......... 250/504 R; 355/66, 67; 359/350, 359, 359/850, 858; 378/34
See application file for complete search history.

(56) References Cited

U.S. PATENT DOCUMENTS

| | | | |
|---|---|---|---|
| 7,161,658 | B2 | 1/2007 | Franken |
| 2004/0256575 | A1* | 12/2004 | Singer .................... B82Y 10/00 250/492.2 |
| 2008/0151221 | A1 | 6/2008 | Sogard |
| 2010/0263192 | A1 | 10/2010 | Phillips |
| 2012/0099088 | A1 | 4/2012 | Phillips |

OTHER PUBLICATIONS

Written Opinion from PCT/US2011/065614, dated Apr. 23, 2012.
International Preliminary Report on Patentability from PCT/US2011/065614, dated Apr. 23, 2012.

* cited by examiner

FLY'S EYE OPTICAL MIRROR WITH A PLURALITY OF OPTICAL ELEMENTS ROTATIONALLY ALIGNED ALONG TWO AXES

CROSS REFERENCE TO RELATED APPLICATIONS

This application is a National Phase application of International Application No.: PCT/US2011/065614, filed on Dec. 16, 2011, which claims priority under 35 U.S.C. § 119(e) to U.S. Provisional Patent Application No. 61/492,725, filed on Jun. 2, 2011, both of which are incorporated by reference herein in their entirety for all purposes.

BACKGROUND

Field of the Invention

This invention relates to lithography, and more particularly, to a fly's eye mirror with optical elements rotationally aligned along two axes.

Description of Related Art

Extreme ultraviolet (EUV) lithography is a known semiconductor manufacturing technology that enables semiconductor wafers with extremely small feature sizes to be fabricated. In a typical EUV lithography tool, an EUV light source is generated from a plasma, such as either a Laser Produced Plasma (LPP) or a Discharge Produced Plasma (DPP). In either case, the EUV light is reflected off a mirror surface and into an illumination unit, which effectively acts as a condenser that collects and uniformly focuses the light onto a reticle. Projection optics then project the image defined by the reticle onto a light-sensitive photoresist material formed on a semiconductor substrate to be patterned. In a series of subsequent chemical and/or etching steps, the pattern defined by the reticle is formed on the substrate under the patterned photoresist. By repeating the above process multiple times, the complex circuitry of semiconductor wafer may be created on the substrate.

The illumination unit typically includes a pair of reflective fly's eye mirrors. Each fly's eye includes a plurality of faceted mirror surfaces arranged in an M×N array. During operation, the radiation from the light source is directed using a collimator onto the mirror surfaces of the first fly's eye. Each of the mirror surfaces reflects a portion of the light onto a corresponding mirror surface on the second fly's eye array. Each of the second fly's eye mirror surfaces is positioned in a pupil plane of a condenser, which condenses the reflected light onto the reticle. With this arrangement, the image field of each mirrored surface of the first fly's eye overlaps at the reticle to form a substantially uniform irradiance pattern.

With both the first and second fly's eye arrays, each of the faceted mirror surfaces should ideally be rotationally or tilt aligned along orthogonal axes. Current fly's eye fabrication techniques, however, result in rotational or tilt alignment only along one axis, but not in orthogonal axes. A conventional fly's eye mirror is fabricated by machining a plurality of monolithic blocks, each with a number of faceted mirror surfaces linearly arranged along a first axis. The monolithic blocks are then mounted, side-by-side, onto a base plate. With this arrangement, the faceted mirror surfaces tend to be in substantial rotational alignment about the orthogonal second axis, but not the first axis since the lineal length of each of the blocks in the first axis is greater than the lineal length of the block in the, orthogonal, second axis. As a result, rotational or tilt mis-alignment alignment of each of the blocks with a base plate will be greater about the first axis and smaller about the second axis as a result of the non-flatness of the mating surfaces of the block and baseplate.

SUMMARY OF THE INVENTION

A fly's eye mirror including first and second complementary M×N arrays, each including a plurality of faceted reflective surfaces arranged along both the first and the second axes, is disclosed. When assembled, the two complementary arrays are integrated together and mounted onto a common base plate. With the increased lineal length of each array along both axes, the faceted reflective surfaces of each array are in rotational or tilt alignment with respect to the base plate along both axes.

BRIEF DESCRIPTION OF THE DRAWINGS

The invention may best be understood by reference to the following description taken in conjunction with the accompanying drawings, which illustrate specific embodiments of the invention.

It should be noted that like reference numbers refer to like elements in the figures.

DETAILED DESCRIPTION OF SPECIFIC EMBODIMENTS

The invention will now be described in detail with reference to various embodiments thereof as illustrated in the accompanying drawings. In the following description, specific details are set forth in order to provide a thorough understanding of the invention. It will be apparent, however, to one skilled in the art, that the invention may be practiced without using some of the implementation details set forth herein. It should also be understood that well known operations have not been described in detail in order to not unnecessarily obscure the invention.

Figure 1:
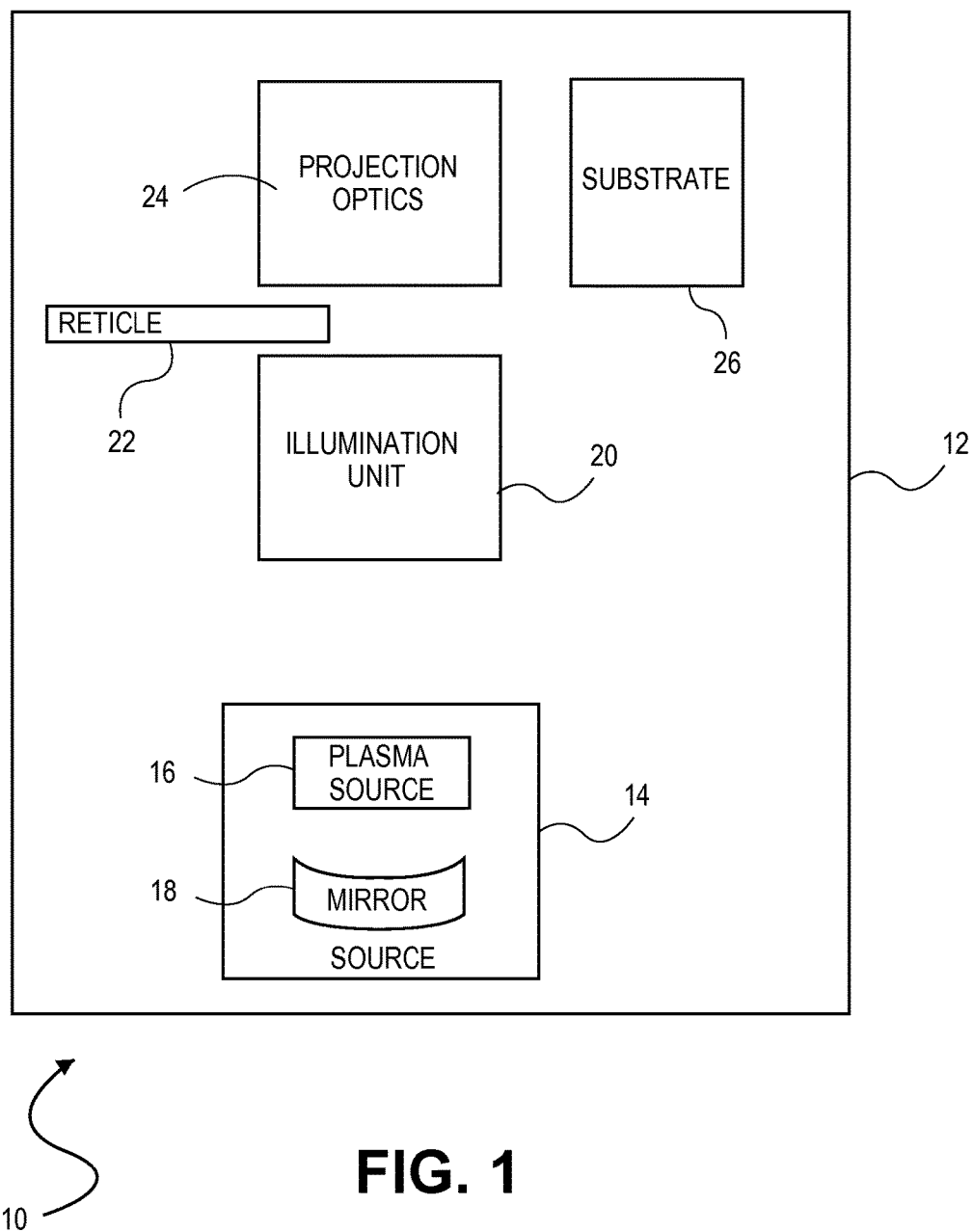
FIG. 1 is a diagram of a EUV lithography tool in accordance with a non-exclusive embodiment of the invention.

Referring to FIG. 1, a diagram of a EUV lithography tool in accordance with a non-exclusive embodiment of the invention is shown. The tool 10 includes, within a vacuum chamber 12, an extreme ultraviolet (EUV) light source 14 including a plasma source 16 and a mirror 18. The tool 10 also includes an illumination unit 20, a reticle 22, and projection optics 24. During operation, EUV light generated by the plasma source 16 is reflected off the mirror 18 and into the illumination unit 20, which effectively acts as a condenser that collects and uniformly focuses the EUV light onto the reticle 22. The image defined by the reticle is then projected by the projection optics 24 onto a light-sensitive photoresist formed on a substrate 26, such as a semiconductor wafer, to be patterned.

Figure 2:
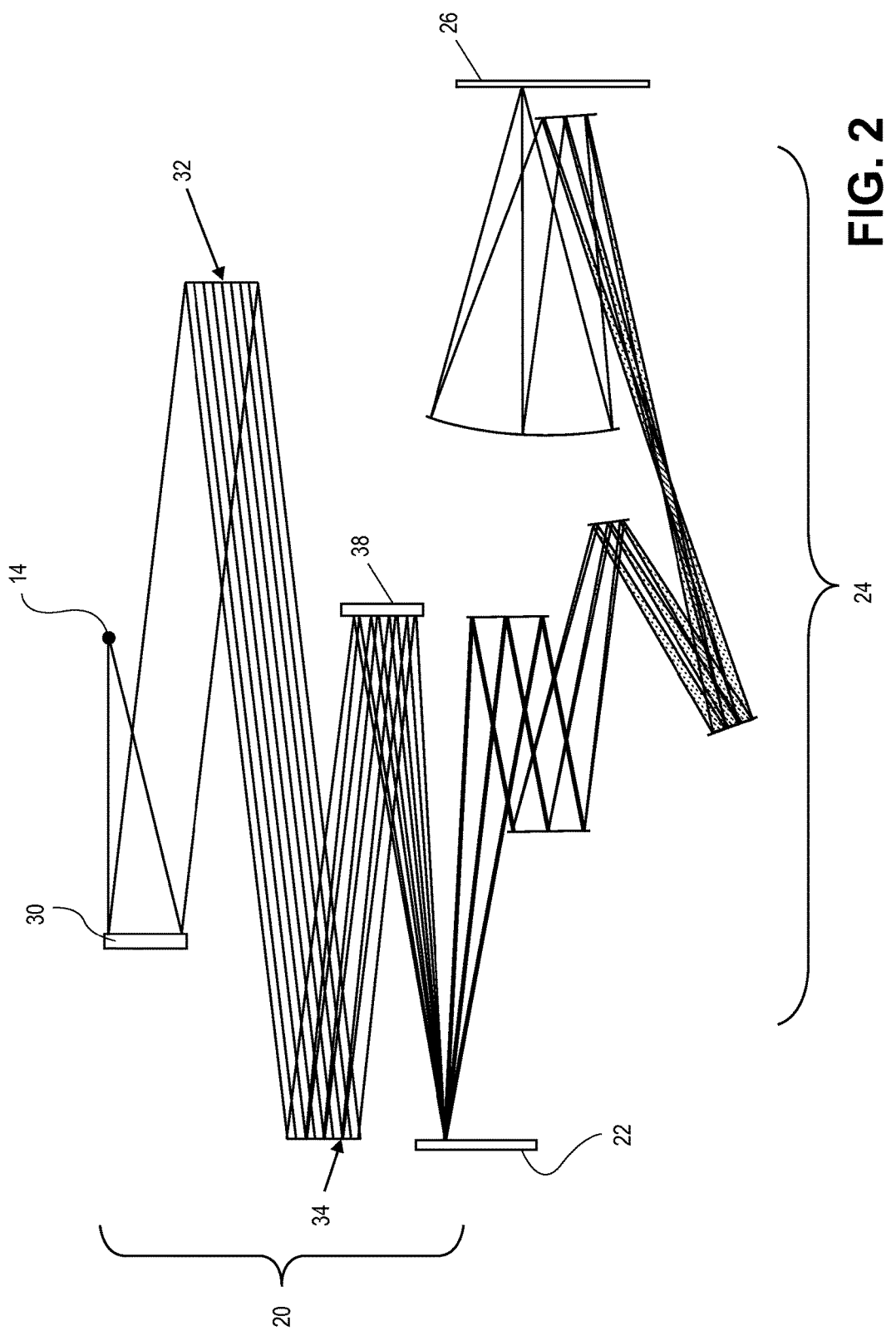
FIG. 2 is an optical diagram of an exemplary illumination unit and the projection optics in the lithography tool of the present invention.

Referring to FIG. 2, an optical diagram of the illumination unit 20 and projection optics 24 in accordance with a non-exclusive embodiment of the invention is shown. The illumination unit 20 includes a first collimator 30, a first fly's eye mirror 32, a second fly's eye mirror 34, and a condenser 38. During operation, the EUV light from the source 14 is reflected off the first fly's eye mirror 32 after being collimated by collimator 30. The faceted mirror surfaces of the first fly's eye 32 forms images of the source 14 at each of the faceted mirror surfaces of the second fly's eye 34. In response, the faceted mirror surfaces of the second fly's eye 34 reflect a uniform image of the first fly's eye 32, through the condenser 38, onto the reticle 22. The pattern defined by the reticle 22 is imaged by the projection optics onto the substrate 26, which is positioned at the image plane of the substrate 26.

Figure 3A:
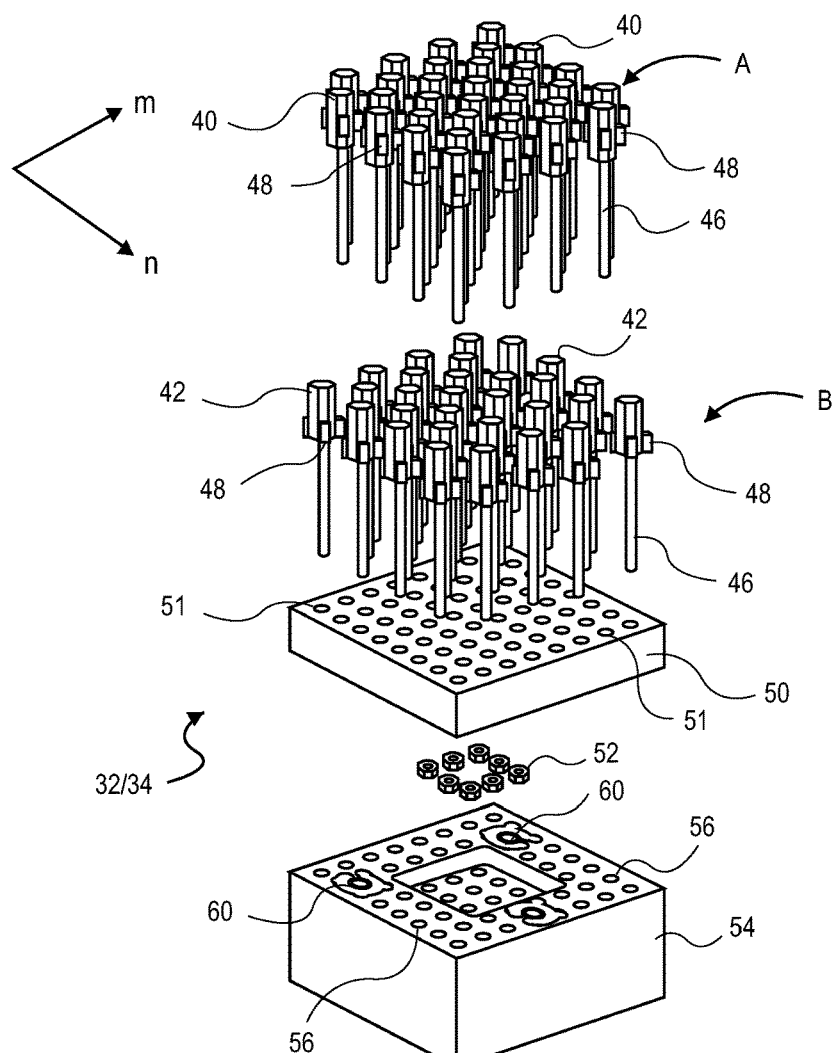
FIGS. 3A and 3B are exploded and top views of an exemplary fly's eye in accordance with the principles of the invention.
Figure 3B:
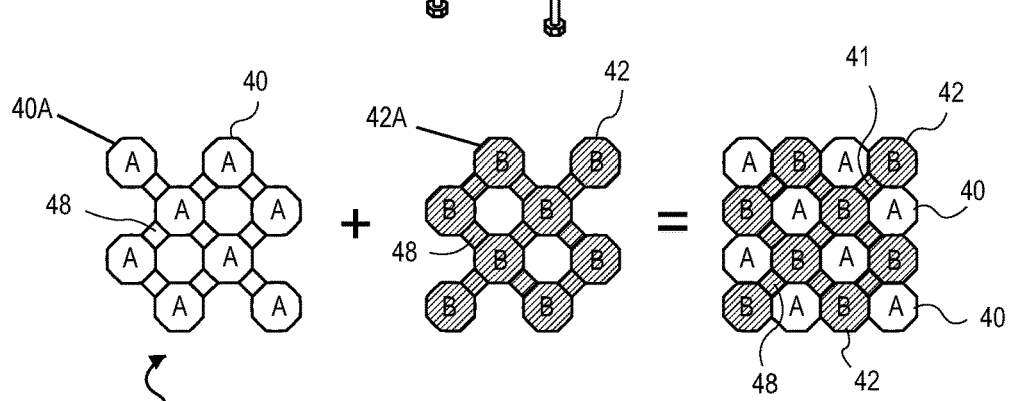

Referring to FIGS. 3A and 3B, exploded and top views of a fly's eye mirror 32/34 in accordance with a non-exclusive embodiment of the invention is shown. The fly's eye mirror array 32/34 includes a first M×N array "A" of first optical elements 40 arranged in a first lattice pattern. Each of the first optical elements 40 can include a plurality of sides 40A, e.g., eight as shown in the emobdiment illustrated in FIG. 3B. The fly's eye mirror 32/34 also includes a second M×N array "B" of second optical elements 42, also arranged in a second lattice pattern that is complementary to the first lattice pattern. Each of the second optical elements 42 can include a plurality of sides 42A, e.g., eight as shown in the embodiment illustrated in FIG. 3B. The first 40 and second 42 optical elements, which are faceted reflective mirror surfaces, are each provided at a first end of a plurality of thermally conductive posts 46. Spacers 48 are also provided adjacent to, or between, each of the first 40 and second 42 optical elements respectively. The arrays A and B are preferably each fabricated to the same specification and tolerances.

As best illustrated in FIG. 3B, the two arrays A and B are designed to compliment one another when assembled to form a fly's eye 32/34. When assembled, the two arrays A and B are integrated together, resulting in the optical elements 40 and 42 positioned side-by-side one another in a lattice-like structure, but separated by spacers 48. Since the arrays A and B are preferably fabricated to the same specification and tolerances, the first 40 and the second 42 optical elements are in alignment with respect to one another along both the M and N axes respectively.

A sub-plate 50 with a two dimensional array of recess regions 51 is used to support the two complementary arrays A and B in alignment with respect to one another. In a non-exclusive embodiment, the second end of each of the posts 46 is passed through and positioned within, without contacting, the plurality of recess regions 51 of the sub-plate 50. First fasteners 52 are used to fasten the posts 46 in place with respect to the sub-plate 50. In one non-exclusive embodiment, the fasteners 52 are nuts that are threaded onto the posts 46. In various additional embodiments, the posts 46 and the sub-plate are made of similar thermally conductive materials, such as but not limited to copper, molybdenum, or Invar.

A base plate 54 is provided under the sub-plate 50. The base plate 54 also includes a plurality of recesses 56 arranged in a M×N array. When the fly's eye 32/34 is assembled, the individual posts 46 extending through the sub-plate 50 and are inserted into the recess regions 56 of the base plate 54. Second fasteners 58, such as bolts, are threaded over the posts 46 and are used to hold the entire assembly together, including the first and second arrays A and B, the sub-plate 50, and the base plate 54. As a result, the individual first 40 and second 42 optical elements of the arrays A and B are integrated together, and in rotational or tilt alignment with respect to the sub-plate 50 and base plate 54 along both the M and N axes.

Figure 3C:
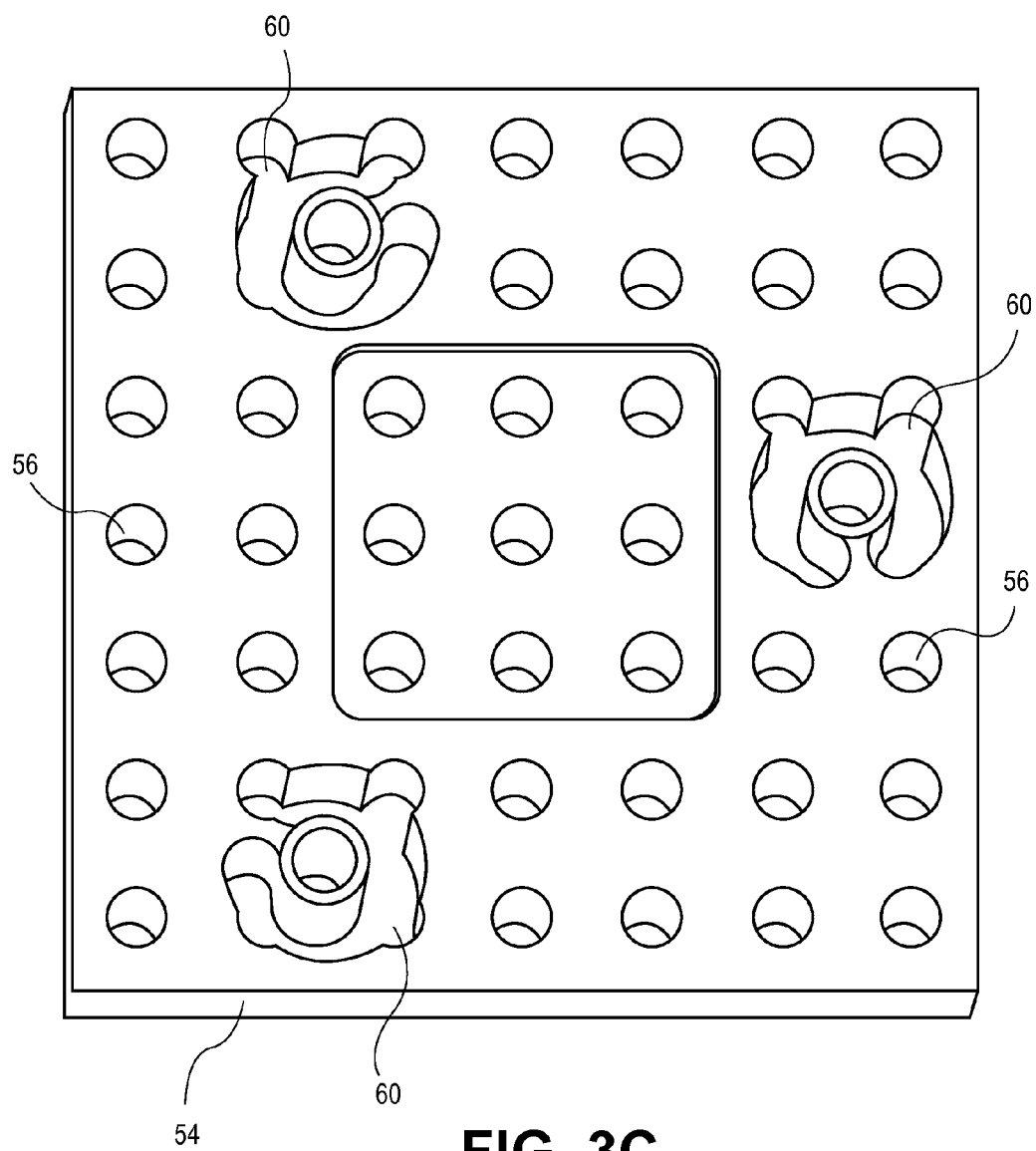
FIG. 3C illustrates a top view of an exemplary base plate used in the fly's eye of the invention.

As best illustrated in FIG. 3C, a plurality of flexures 60 are provided on the surface of the base plate that contact the sub-plate 50. The flexures 60 are provided to minimize the effects of differential thermal expansion between the sub-plate 50 and the base plate 54. In one non-exclusive embodiment, the base plate 54 is made of an Invar material. In other embodiments, the base plate 54 is made of Aluminum Oxide or Fused Silica, Low thermal expansion glass-ceramic such as Clearceram-Z™.

Figure 4:
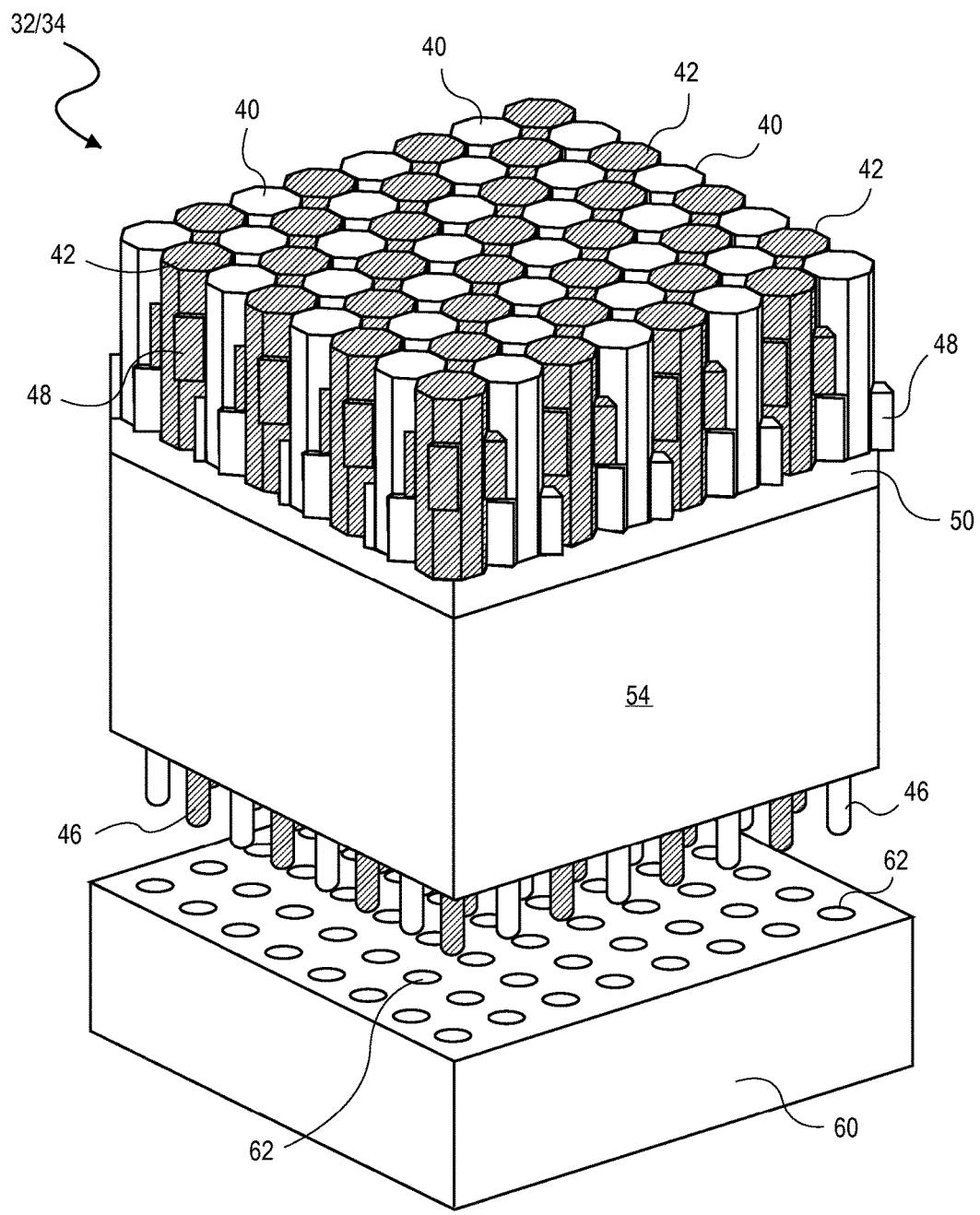
FIG. 4 is a diagram of an exemplary cooling element used for cooling the fly's eye according to another embodiment of the invention.

Referring to FIG. 4 a diagram of an assembled fly's eye 32/34 is shown. The two arrays A and B are secured to the sub-plate 50 and the base plate 54 by the first fasteners 52 and the second fasteners 58 (neither of which are visible in the Figure). The optical elements 40 and 42 are thus arranged in a two-dimensional array and are in rotational or tilt alignment with respect to one another and the sub-plate 50 and base plate 54 along both the axes. In addition, the spacers 46 keep the individual optical elements 40 and 42 spaced apart from one another.

In an optional embodiment, the fly's eye 32/34 as described above may be used in cooperation with a cooling element 60. With this embodiment, a plurality of wells 62 is arranged in a two-dimensional array on the top surface of the cooling element 60. Each of the wells 62 is configured to receive the exposed second end the posts 46 extending through the base plate 54 respectively. In various alternatives, the wells 62 are filled with a thermally conductive liquid, such as but not limited to, liquid metals. As a result, a direct thermal path is established from the individual optical elements 40 and 42 to the cooling element through the posts 46 and conductive liquid.

In yet other embodiments, the fly's eye 32/34 can be made from three or more arrays. Each of the arrays, regardless of the number, can be integrated in a similar manner as described above. In yet another embodiments, the fly's eye assembly can be assembled without either the sub-plate 50 or the base plate 54.

Figure 5A:
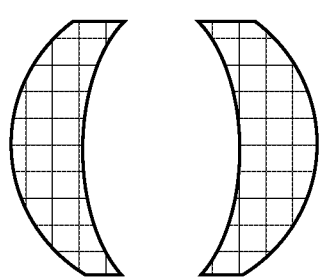
FIGS. 5A through 5D are examples of various non-exclusive pole configurations of the fly's eye of the present invention.
Figure 5B:
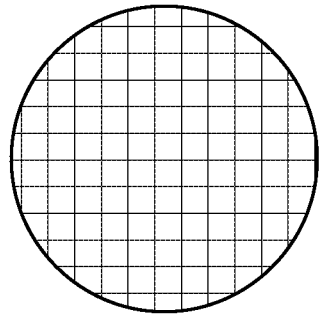
Figure 5C:
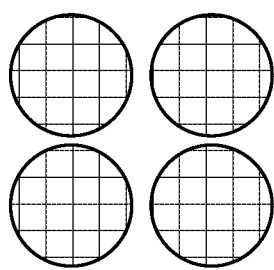
Figure 5D:
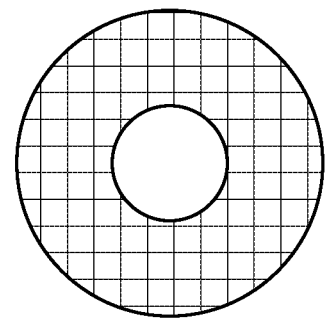

FIGS. 5A through 5D are examples of various non-exclusive pole configurations for the fly's eye mirrors 32/34 of the present invention. For example, one or more of the fly's eyes 32/34 can be configured in a di-pole (FIG. 5A), mono-pole (FIG. 5B), quad-pole (FIG. 5C) or an annular-pole (FIG. 5D). It should be noted that these configurations are merely exemplary and are provided for illustrative purposes. Any pole configuration may be used.

Figure 6A:
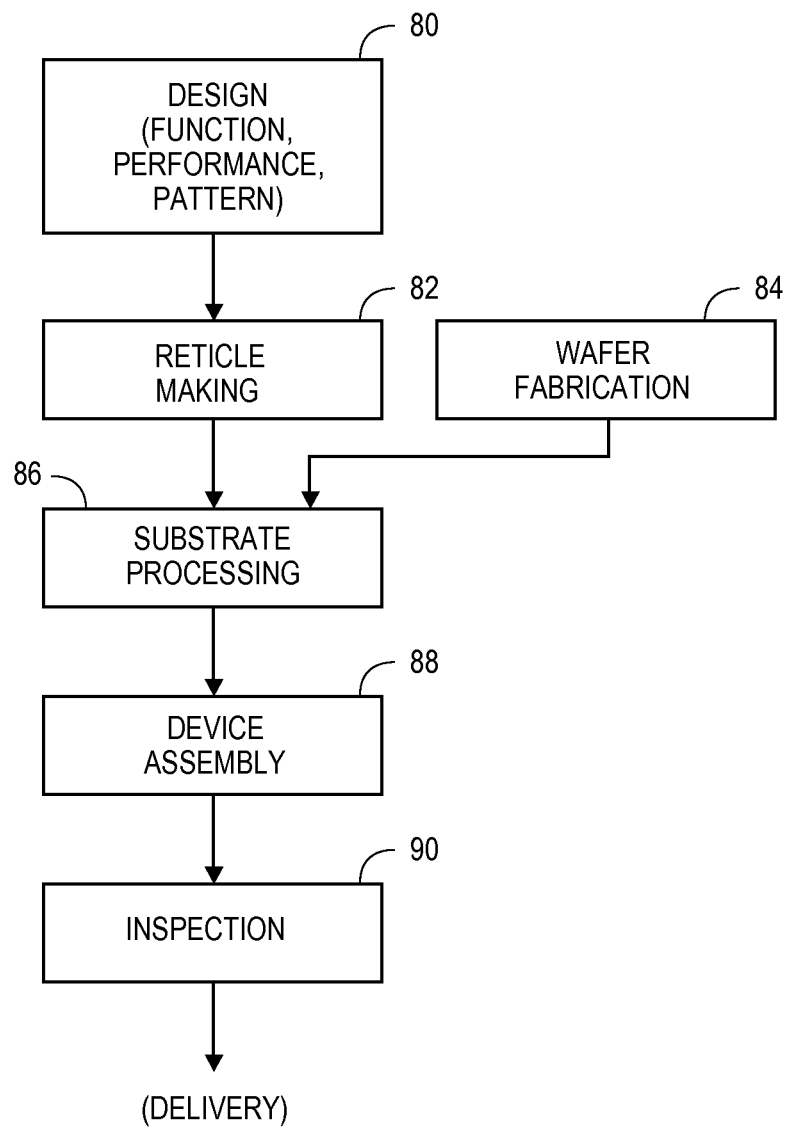
FIGS. 6A and 6B are flow charts that outline a process for designing and making a substrate device.

Devices, such as semiconductor die on a wafer or LCD panels, are fabricated by the process shown generally in FIG. 6A. In step 80 the function and performance characteristics of the device are designed. In the next step 82, one or more reticles, each defining a pattern, are developed according with the previous step. In a related step 84 a "blank" substrate, such as a semiconductor wafer, is made and prepared for processing. The substrate is then processed in step 86 at least partially using the photolithography tool 10 as described herein. In step 88, the substrate is diced and assembled and then inspected in step 90.

Figure 6B:
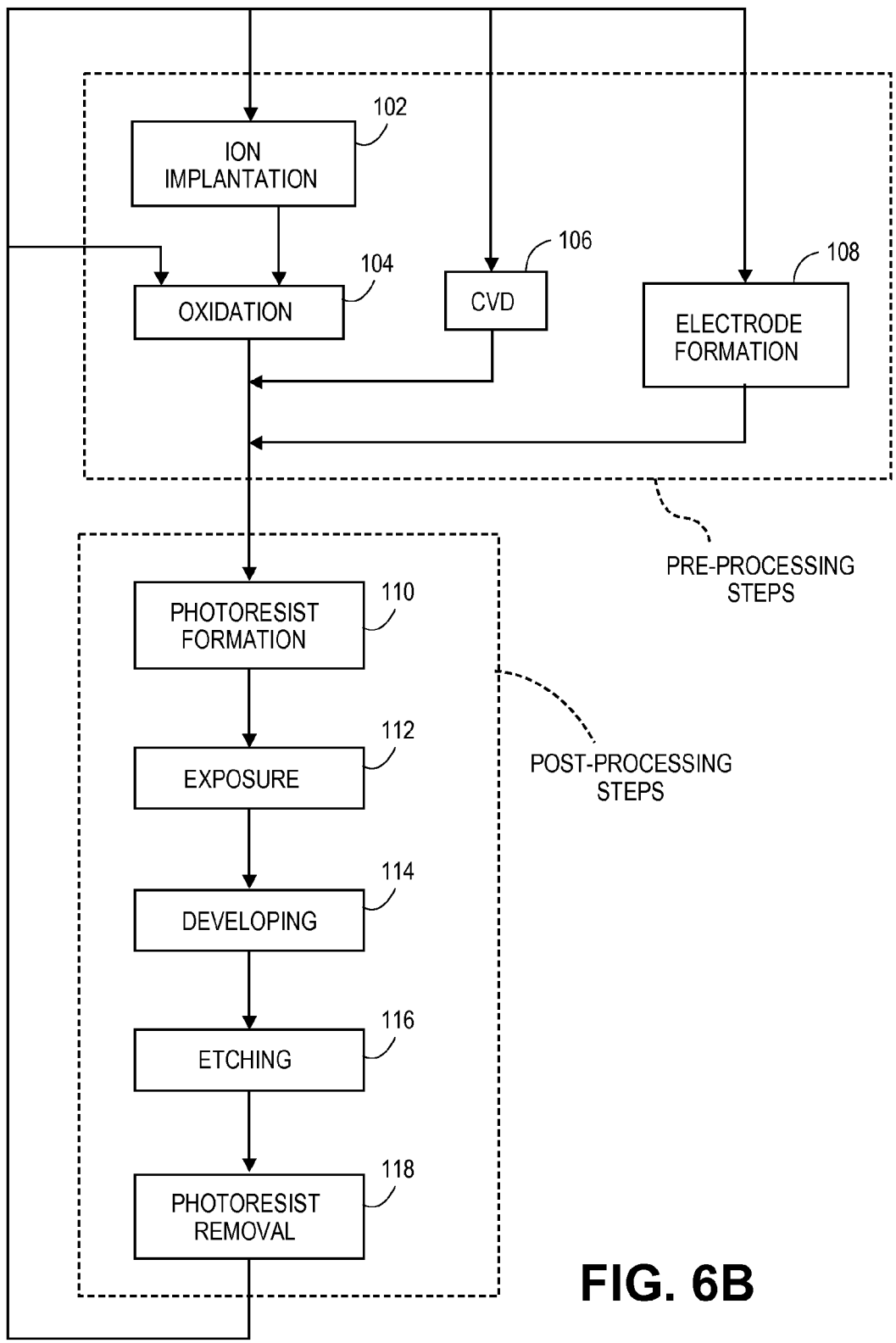

FIG. 6B illustrates a detailed flowchart example of the above-mentioned step 86 in the case of fabricating semiconductor devices. In step 102 (ion implantation step), ions are implanted in the wafer. In step 104 (oxidation step), the substrate wafer surface is oxidized. In step 106 (CVD step), an insulation film is formed on the wafer surface. In step 108 (electrode formation step), electrodes are formed on the wafer by vapor deposition. The above-mentioned steps 102-108 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 110 (photoresist formation step), photoresist is applied to a wafer. Next, in step 112 (exposure step), the lithography tool 10 as described herein is used to transfer the pattern of the reticle 22 to the wafer. Then in step 114 (developing step), the exposed wafer is developed, and in step 116 (etching step), parts other than residual photoresist (exposed material surface) are removed by etching. In step 118 (photoresist removal step), unnecessary photoresist remaining after etching is removed. Multiple circuit patterns are formed by repetition of these preprocessing and post-processing steps. Although not described herein, the fabrication of LCD panels from glass substrates is performed in a similar manner.

Although many of the components and processes are described above in the singular for convenience, it will be appreciated by one of skill in the art that multiple components and repeated processes can also be used to practice the techniques of the system and method described herein. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the invention may be employed with a variety of components and should not be restricted to the ones mentioned above. It is therefore intended that the invention be interpreted to include all variations and equivalents that fall within the true spirit and scope of the invention.

What is claimed is:

1. A mirror structure for reflecting incident light onto a surface, comprising:
   a first sub-structure including a plurality of spaced apart first mirror surfaces that reflect the incident light onto the surface, with more than one of the first mirror surfaces arranged along both a first axis and a second axis; and
   a second sub-structure including a plurality of spaced apart second mirror surfaces that reflect the incident light onto the surface, with more than one of the second mirror surfaces arranged along both the first axis and the second axis;
   the first sub-structure and the second sub-structure being integrated together with respect to one another so that the first mirror surfaces and the second mirror surfaces are positioned side-by-side relative to one another along both the first axis and the second axis to form the mirror structure, wherein at least one of the first mirror surfaces is positioned between second mirror surfaces along one of the first axis and the second axis.

2. The mirror structure of claim 1, wherein the first sub-structure and the second sub-structure are integrated together with respect to one another so that the first mirror surfaces and the second mirror surfaces are in rotational alignment.

3. The mirror structure of claim 1, further comprising a base, and wherein the first sub-structure and the second sub-structure are integrated together onto the base in a lattice-like structure.

4. The mirror structure of claim 1, further comprising a plurality of spacers positioned in a space between the mirror surfaces when the first sub-structure and the second sub-structure are integrated together.

5. A mirror structure comprising:
   a first sub-structure including a plurality of spaced apart first mirror surfaces with more than one of the first mirror surfaces arranged along both a first axis and a second axis; and
   a second sub-structure including a plurality of spaced apart second mirror surfaces with more than one of the second mirror surfaces arranged along both the first axis and the second axis;
   the first sub-structure and the second sub-structure being integrated together with respect to one another so that the first mirror surfaces and the second mirror surfaces are positioned side-by-side relative to one another along both the first axis and the second axis to form the mirror structure, wherein at least one of the first mirror surfaces is positioned between second mirror surfaces along one of the first axis and the second axis, and wherein at least one of the first mirror surfaces and at least one of the second mirror surfaces are each positioned at a first end of a plurality of posts respectively.

6. The mirror structure of claim 5, wherein each of the plurality of posts is thermally conductive.

7. The mirror structure of claim 5, further comprising a support member configured to receive a second end of the plurality of posts through an array of recess regions formed in the support member respectively.

8. The mirror structure of claim 7, further comprising a plurality of first fasteners configured to fasten the plurality of posts to the support member.

9. The mirror structure of claim 7, wherein the support member and the plurality of posts are configured so that the second end of the plurality of posts pass through, but do not contact, the plurality of recess regions of the support member respectively.

10. The mirror structure of claim 7, wherein the plurality of posts and the support member have similar thermally conductive properties.

11. The mirror structure of claim 7, wherein the plurality of posts and the support member each consist of one or more of the following: copper, molybdenum, or Invar.

12. The mirror structure of claim 7, further comprising a base, and wherein the support member is positioned between the first and the second mirror surfaces and the base.

13. The mirror structure of claim 12, further comprising one or more flexures provided between the support member and the base.

14. The mirror structure of claim 13, further comprising second fasteners for fastening the support member and the base together.

15. The mirror structure of claim 14, wherein the base includes a plurality of recesses formed therein, the second end of the plurality of posts configured to pass through the plurality of recesses formed in the base respectively.

16. The mirror structure of claim 15, wherein the base consists of one of the following materials: Invar, aluminum oxide, fused silica, or a glass- ceramic.

17. The mirror structure of claim 5, further comprising a cooling element configured to contact a second end of each of the plurality of posts so that a thermally conductive path is provided between the first and the second mirror surfaces and the cooling element respectively.

18. The mirror structure of claim 17, wherein the cooling element is a cooling block having a plurality of wells configured to receive the second end of the plurality of posts respectively.

19. The mirror structure of claim 18, wherein the plurality of wells each contains coolant.

20. The mirror structure of claim 19, wherein the coolant consists of one of the following: liquid metal or a thermally conductive liquid.

21. The mirror structure of claim 1, wherein the first and the second mirror surfaces of the first and the second sub-structures are complementary.

22. An extreme ultraviolet (EUV) lithography tool, comprising:
an EUV light source;
an illumination unit, the illumination unit including the mirror structure as recited in claim 1; and
projection optics configured to project EUV light received from the illumination unit onto a substrate.

23. The tool of claim 22, wherein the mirror structure is configured into one of the following pole arrangements:
(i) di-pole;
(ii) mono-pole;
(ii) mono-pole;
(iii) quad-pole; and
(iv) an annular-pole.

24. A mirror structure comprising:
a first sub-structure including a plurality of spaced apart first mirror surfaces with more than one of the first mirror surfaces arranged along both a first axis and a second axis, at least one of the first mirror surfaces having a first shape; and
a second sub-structure including a plurality of spaced apart second mirror surfaces with more than one of the second mirror surfaces arranged along both the first axis and the second axis, at least one of the second mirror surfaces having a second shape that is substantially similar to the first shape; and
the first sub-structure and the second sub-structure being integrated together with respect to one another so that the first mirror surfaces and the second mirror surfaces are positioned side-by-side relative to one another along both the first axis and the second axis to form the mirror structure, wherein at least one of the first mirror surfaces is positioned between second mirror surfaces along one of the first axis and the second axis.

25. The mirror structure of claim 24 wherein when the first sub-structure and the second sub-structure are integrated together, each of the first mirror surfaces is positioned directly adjacent to at least one of the second mirror surfaces.

26. The mirror structure of claim 1 wherein the mirror structure is a fly's eye mirror.

27. The mirror structure of claim 1 wherein the first sub-structure and the second sub-structure are fabricated to the same specification and tolerances.

28. A mirror structure for reflecting incident light onto a surface, comprising:
a first sub-structure including a plurality of spaced apart first mirror surfaces that are spaced apart along a first axis, the first mirror surfaces reflecting the incident light onto the surface, each of the first mirror surfaces including a plurality of sides with at least one side being oriented parallel to the first axis; and
a second sub-structure including a plurality of spaced apart second mirror surfaces that are spaced apart along the first axis, the second mirror surfaces reflecting the incident light onto the surface;
the first sub-structure and the second sub-structure being integrated together with respect to one another so that the first mirror surfaces and the second mirror surfaces alternate along the first axis, wherein at least one of the first mirror surfaces is positioned directly between second mirror surfaces along the first axis.

29. A mirror structure for reflecting incident light onto a surface, comprising:
a first sub-structure including a plurality of spaced apart first mirror surfaces that are spaced apart along a first axis, the first mirror surfaces reflecting the incident light onto the surface; and
a second sub-structure including a plurality of spaced apart second mirror surfaces that are spaced apart along a second axis that intersects the first axis, the second mirror surfaces reflecting the incident light onto the surface;
the first sub-structure and the second sub-structure being integrated together with respect to one another such that each of the plurality of first mirror surfaces is positioned directly adjacent to at least two of the plurality of second mirror surfaces, and such that each of the plurality of second mirror surfaces is positioned directly adjacent to at least two of the plurality of first mirror surfaces.

* * * * *

UNITED STATES PATENT AND TRADEMARK OFFICE
CERTIFICATE OF CORRECTION

PATENT NO. : 10,114,193 B2
APPLICATION NO. : 14/118858
DATED : October 30, 2018
INVENTOR(S) : Alton H. Phillips Page 1 of 1

It is certified that error appears in the above-identified patent and that said Letters Patent is hereby corrected as shown below:

In the Claims

Column 6, Line 55, the claim reference "13" should read --12--

Column 6, Line 58, the claim reference "14" should read --12--

Column 6, Line 62, the claim reference "15" should read --12--

Column 7, Line 26, delete "(ii) mono-pole"

Signed and Sealed this
Ninth Day of April, 2019

Andrei Iancu
*Director of the United States Patent and Trademark Office*